(12) United States Patent
Chou

(10) Patent No.: US 8,198,907 B2
(45) Date of Patent: Jun. 12, 2012

(54) PIN CONNECTOR AND CHIP TEST FIXTURE HAVING THE SAME

(75) Inventor: Shih-Yang Chou, Taipei (TW)

(73) Assignee: Giga-Byte Technology Co., Ltd., Taipei County (TW)

( * ) Notice: Subject to any disclaimer, the term of this patent is extended or adjusted under 35 U.S.C. 154(b) by 396 days.

(21) Appl. No.: 12/627,501

(22) Filed: Nov. 30, 2009

(65) Prior Publication Data

US 2011/0128021 A1    Jun. 2, 2011

(51) Int. Cl.
*G01R 31/02* (2006.01)
*G01R 31/20* (2006.01)
(52) U.S. Cl. ............... 324/750.1; 324/757.02
(58) Field of Classification Search .......... None
See application file for complete search history.

(56) References Cited

U.S. PATENT DOCUMENTS

| 3,676,777 | A | * | 7/1972 | Charters | 324/754.07 |
| 4,975,637 | A | * | 12/1990 | Frankeny et al. | 324/750.11 |
| 7,330,025 | B1 | * | 2/2008 | Beach et al. | 324/762.02 |
| 7,385,408 | B1 | * | 6/2008 | Adney et al. | 324/756.02 |

FOREIGN PATENT DOCUMENTS

TW    I310460    6/2009

* cited by examiner

*Primary Examiner* — Vinh Nguyen
(74) *Attorney, Agent, or Firm* — Chun-Ming Shih

(57) ABSTRACT

A chip test fixture for assisting in examining a test chip on a printed circuit board includes a switching module, a pin cord and a magnetic unit. The switching module includes a standard chip and a switch element configured to turn on either the standard chip or the test chip. The pin cord is connected with the switch module at one end and is formed with a contacting head at the other end. The contacting head has a set of contact pins corresponding to that of the test chip. The magnetic unit is configured to draw the contacting head of the pin cord and the test chip together in such a way that the contact pins of the contacting head are in contact with that of the test chip once the contacting head approaches the test chip.

18 Claims, 3 Drawing Sheets

PIN CONNECTOR AND CHIP TEST FIXTURE HAVING THE SAME

BACKGROUND OF INVENTION

1. Field of Invention

This invention relates to a pin connector and a chip test fixture having the same, and more particularly to a chip test fixture for assisting in inspecting a test chip on a printed circuit board.

2. Related Prior Art

Typically, when a printed circuit board breaks down or cannot function well, it is quite difficult to identify which chip or chips go wrong. Any suspected chips, no matter good or not, will be detached from the printed circuit board for inspection in order to find out the failed one. Furthermore, when a chip fails in service, the root cause of the failure lies in the data or software which is installed in the chip although the chip itself may lead to failures either. If the problem is caused by the data or software, the chip can easily be restored and run well again by updating the failed data or software, without the need to be removed from the printed circuit board.

One such system is described in Taiwan Pat. No. I310460 for testing a chip on a printed circuit board and includes a substitute circuit board, a substitute chip connected to the substitute circuit board, and a switch. When being connected to the chip, the printed circuit board can replace the chip with the substitute chip for operation by the use of the switch. If the substitute chip still cannot function well on the printed circuit board, the failure may be not caused from the chip, but other chips. However, if the replacement of the substitute chip does solve the problem to have the printed circuit board functions well again, the chip is therefore confirmed to have some problems. By this way, the damaged chip can be quick identified. Particularly, without being disassembled from the printed circuit board, all the suspected chips can be directly inspected on the board to find out the damaged one. Some chips may also be restored by simply updating the data or software stored in the chips as long as the chips themselves are not failed. However, if truly failed, the chips may have to be removed from the printed circuit board and be replaced by new good chips.

Another mechanism for chip test fixture includes a clamping head with contact pins thereon for coming into contact with the contact pins of the suspected chip that is mounted on the printed circuit board. Although this clamping head enables its contact pins to make a solid connection with that of the chip, the use of the clamping head over a long period of time by repeatedly attaching and detaching the clamping head to the chip can cause a poor contact therebetween afterward. Thus, it is troublesome that the old clamping head has to be taken out and replaced by a new one all the time.

SUMMARY OF INVENTION

Broadly stated, the present invention is directed to a chip test fixture for assisting in inspecting a test chip on a printed circuit board by the use of magnetism, in replace of the clamping force exerted by the aforementioned clamping head.

Specifically, the chip test fixture includes a switching module and a pin connector. The switching module includes a standard chip and a switch element configured to turn on either the standard chip or the test chip. The pin connector includes a pin cord and a magnetic unit. The pin cord is formed with a contacting head and a connecting plug at opposite ends thereof. The contacting head has a set of contact pins corresponding to that of the test chip. The connecting plug is presented for connecting with the switching module. On the other hand, the magnetic unit includes a magnet and a magnetic sticker to be attracted by the magnet. The magnet is secured on the contacting head of the pin cord while the magnetic sticker is adhered to the test chip. In such a manner, the contact pins of the contacting head are drawn to be in contact with that of the test chip once the contacting head approaches the test chip.

In virtue of the magnetism, the contact head can be easily attached to or detached from the chip for inspecting the same over a long period of time.

Other advantages of the present invention will be understood more readily after a consideration of the drawings and the Detailed Description.

BRIEF DESCRIPTION OF DRAWINGS

The invention will now be described by way of example with reference to embodiment(s) shown in the accompanying Figures.

DETAILED DESCRIPTION OF EMBODIMENTS

Figure 1:
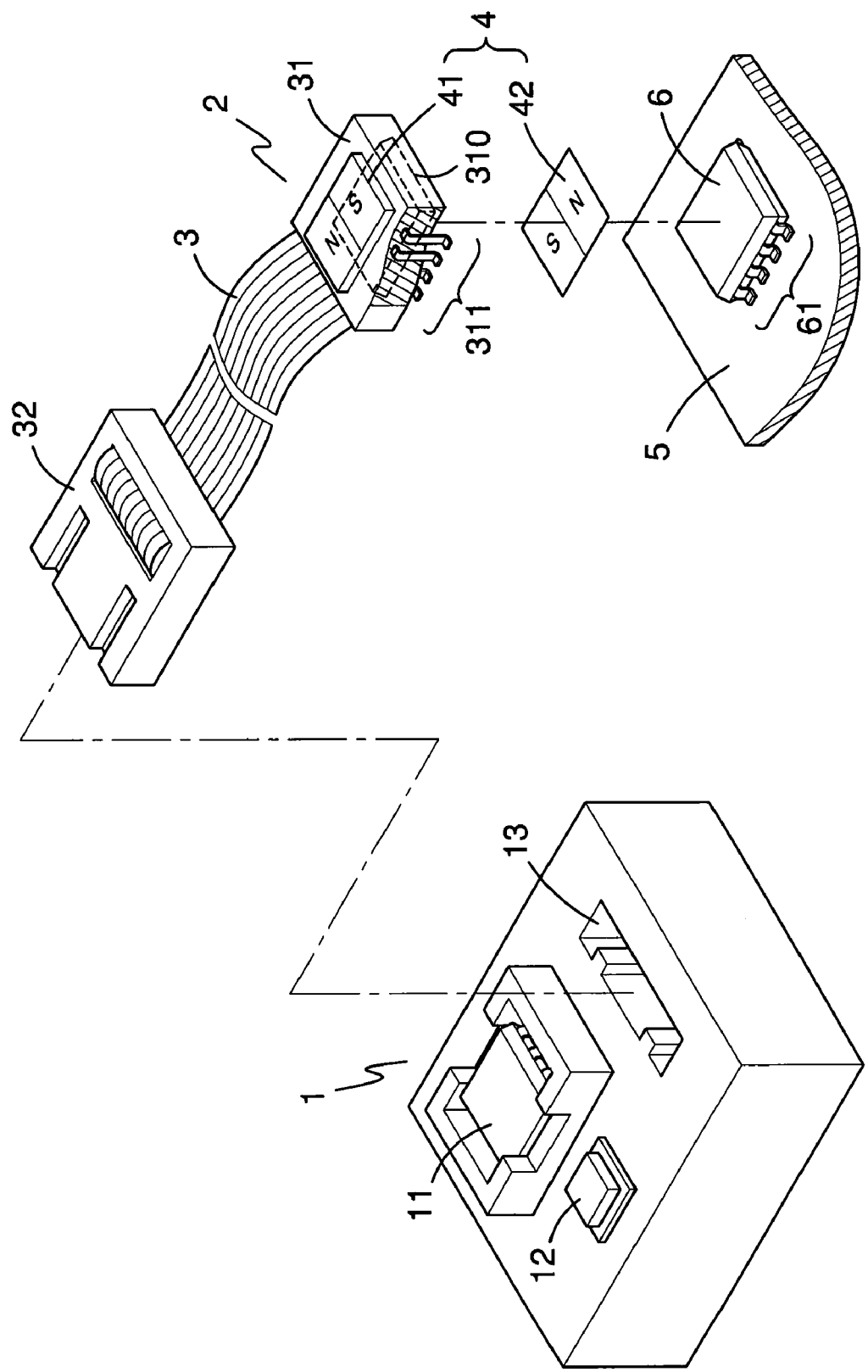
FIG. 1 illustrates an exploded view of a chip test fixture in accordance with the preferred embodiment of the invention.
Figure 2:
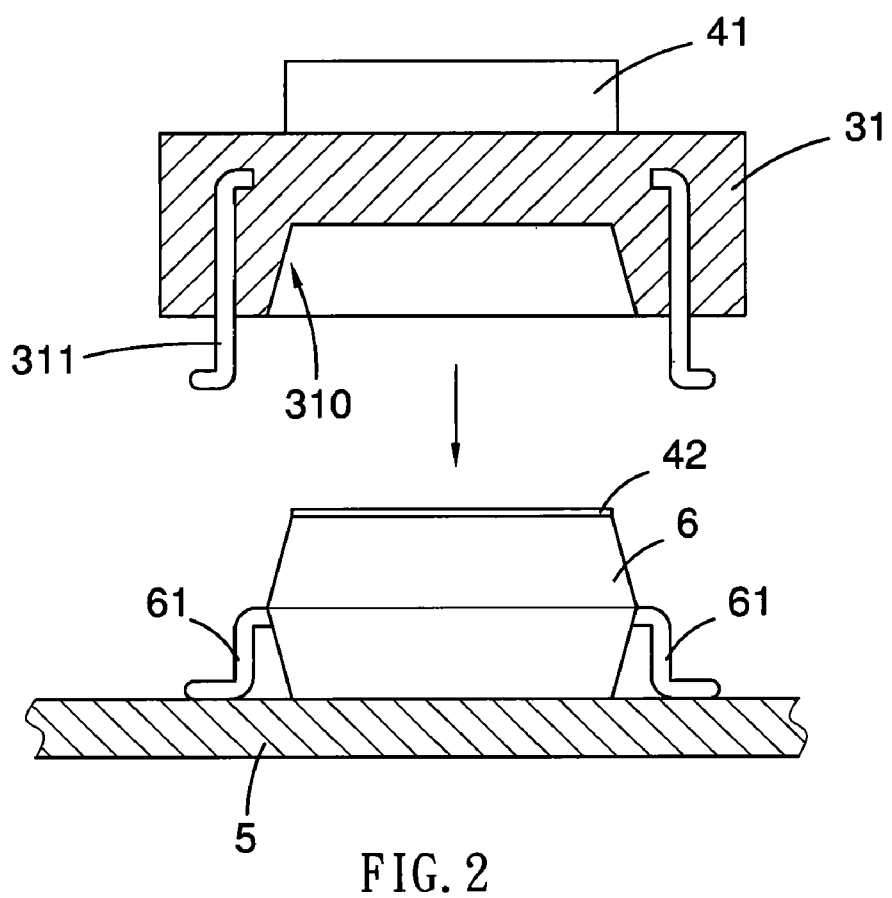
FIG. 2 is a cross section of a contact head of the chip test fixture together with a chip to be connected with the contact head.
Figure 3:
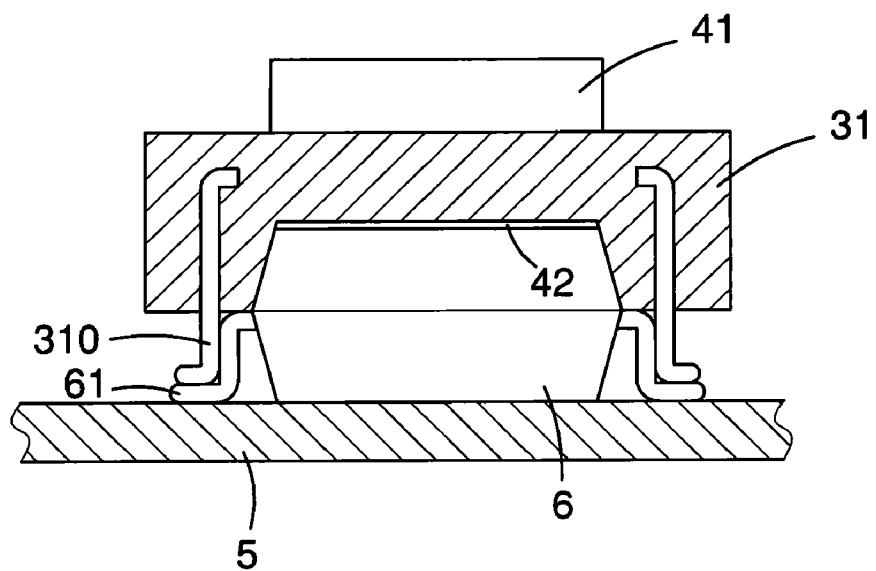
FIG. 3 is a cross section of the chip test fixture, illustrating that the contact head and the chip are connected together.

Referring now to FIGS. 1 to 3 of the drawings, a chip test fixture in accordance with the preferred embodiment of the invention is provided for assisting in inspecting a test chip 6 which is mounted on a printed circuit board 5. The chip test fixture mainly includes a switching module 1 and a pin connector 2. The pin connector 2 is presented for connecting the switching module 1 and the test chip 6 and includes a pin cord 3 and a magnetic unit 4.

As shown in FIG. 1, the switch module 1 includes a standard chip 11, a switch element 12 and a connecting port 13. The switch element 12 is configured to enable either the standard chip 11 or the test chip 6 to work on the printed circuit board 5. For instance, when the chip test fixture is electrically connected to the test chip 6 that is on the printed circuit board 5, the switch element 12 can then be operated to simultaneously turn on (enable) the standard chip 11 and turn off (disable) the test chip 6. That is, the standard chip 11, in replace of the test chip 6, can run on the printed circuit board 5. If the replacement of the standard chip 11 still cannot function well on the printed circuit board 5, it denotes that the failure may be not caused from the suspected test chip 6, but other chip. However, if the replacement of the standard chip 11 does solve the problem, it means the test chip 6 is indeed the root cause of the problem. Because of that, whether a chip is good or not can easily be identified on the printed circuit board, without the need to be removed therefrom.

The pin cord 3 has a contacting head 31 and a connecting plug 32 at opposite ends thereof. The contacting head 31 of the pin cord 3 has a set of contact pins 311 corresponding to a set of contact pins 61 of the test chip 6. The connecting plug 32 of the pin cord 3 is provided to be inserted into the connecting port 13 of the switch module 1 for connection with the switch module 1.

Additionally, the magnetic unit 4 is configured to draw the contacting head 31 of the pin cord 3 and the test chip 6 together. That is, when the contacting head 31 approaches the test chip 6, the engagement between the contacting head 31 and the test chip 6 enables the contact pins 311 of the contacting head 31 to be in contact with the contact pins 61 of the test chip 6 respectively.

Specifically, the magnetic unit 4 includes a magnet 41 and a magnetic sticker 42. The magnet 41 is secured on the contacting head 31 of the pin cord 3 while the magnetic sticker 42 is adhered on top of the test chip 6, as shown in FIG. 2. Therefore, when the contacting head 31 of the pin cord 3 approaches the test chip 6, the contacting head 31 and the test chip 6 are drawn closer to each other to have the contact pins 311 of the contacting head 31 in tight contact with the contact pins 61 of the test chip 6, as depicted in FIG. 3. On the contrary, after the test chip 6 is finished with defect inspection, the contacting head 31 of the pin cord 3 can also be easily removed from the test chip 6 and then move on to check another suspected chip.

Referring back to FIG. 1, a fool-proof mechanism is included in the magnetic unit 4 to reduce the probability of contacting the contacting head 31 with the test chip 6 in a wrong direction, which may cause unnecessary electric contact failure. For this, the magnet 41 are arranged to have its north and south magnetic poles (N), (S) attracting the south and north magnetic poles (S), (N) of the magnetic sticker 42 respectively. By this way, once the contacting head 31 of the pin cord 3 is placed in the wrong direction with respect to the test chip 6, the test chip 6 attracts not the contact head 31, but repels the same instead. Thus, mismatch between the contact pins 311 of the contacting head 31 and the contact pins 61 of the test chip 6 can be found and avoided beforehand.

Figure 4:
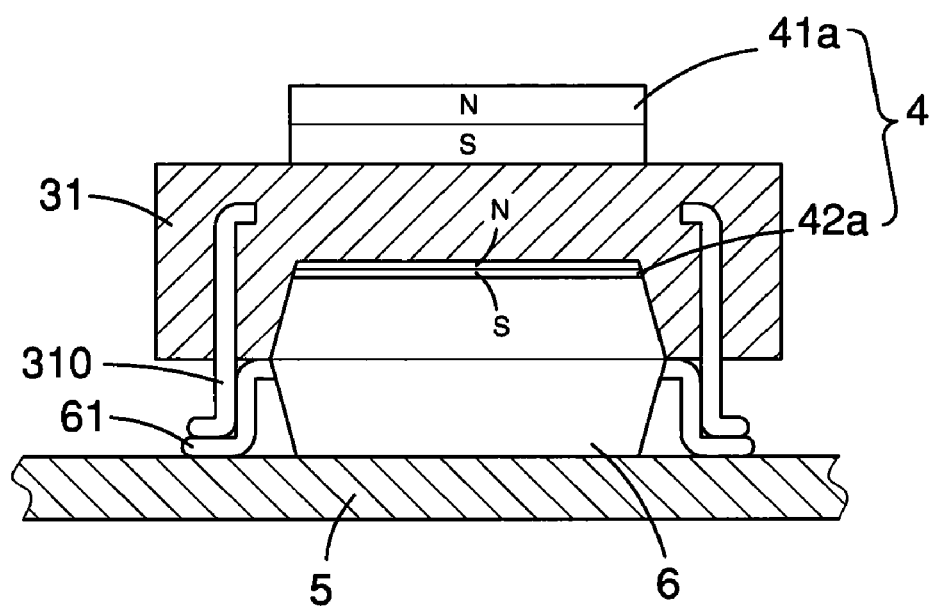
FIG. 4 is a view similar to FIG. 3, showing that the chip test fixture employs another example of magnetic unit.

Another example of a magnetic unit 4 is illustrated in FIG. 4. As with the magnetic unit 4 of FIG. 1, the modified magnetic unit 4 includes a magnet 41a disposed on the contacting head 31 and a magnetic sticker 42a adhered on top of the test chip 6. The major difference is that the magnet 41a has opposite upper and lower magnetic poles (N, S) laminated to each other, and the magnetic sticker 6 has opposite upper and lower magnetic poles (N, S) laminated to each other as well. In this embodiment, when the magnetic sticker 42a is adhered to the test chip 6, it is the lower south magnetic pole (S) of the magnetic sticker 6 which is bonded with the top surface of the test chip 6. And, the upper north magnetic pole (N) of the magnetic sticker 42a is ready for upwardly attracting the lower south magnetic pole (S) of the magnet 41a. As such, when the contacting head 31 of the pin cord 3 is drawn near to the test chip 6, the lower south magnetic pole (S) of the magnet 41a will attract the upper north magnetic pole (N) of the magnetic sticker 42a. Therefore, the contacting head 31 can easily be attached to the test chip 6 to have the contact pins 311 of the contacting head 31 and the contact pins 61 of the test chip 6 in contact with each other. On the other hand, the contacting head 31 can easily be detached from the test chip 6 as well.

Figure 5:
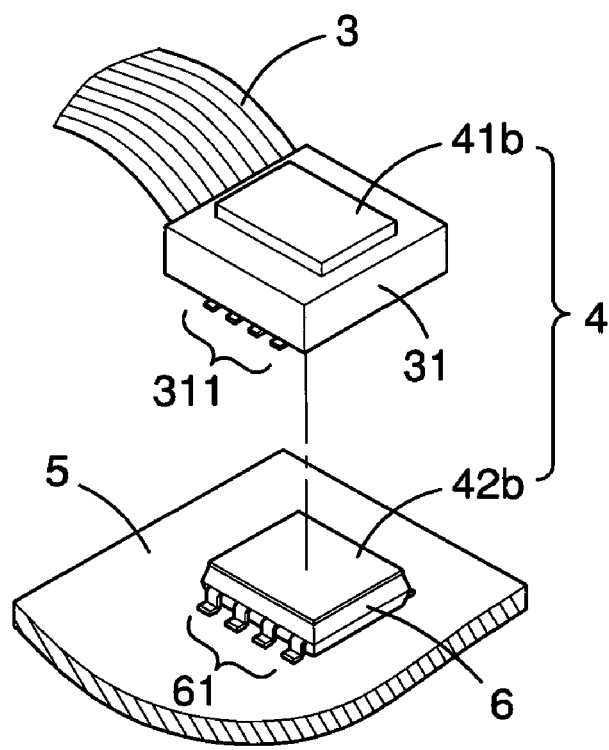
FIG. 5 is a perspective view of the chip test fixture employing yet another example of magnetic unit.

FIG. 5 provides a view of a magnetic unit 4 in yet another alternate example. This magnetic unit 4 includes a magnet 41b and a sheet metal 42b, such as iron sheet, to be attracted by the magnet 41b. The magnet 41b and the sheet metal 42b are secured on the contacting head 31 of the pin cord 3 and test chip 6 respectively. In virtue of the magnetism between the magnet 41b and the sheet metal 42b, the contacting head 31 can also be easily attached to the test chip 6 in order to have the contact pins 311 and 61 in contact with each other. Likewise, the contacting head 31 can easily be detached from the test chip 6 as well.

Referring back to FIGS. 2 and 3, the contacting head 31 of the pin cord 3 defines a cavity 310 in a bottom thereof for reception of the test chip 6. When the test chip 6 is received in the cavity 310 of the contacting head 31, the contact pins 311 of the contacting head 31 is exactly in contact with that of the test chip 6. This ensures that when the contacting head 31 and the test chip 6 are attracted due to the magnetism of the magnetic unit 4, misalignment between the contact pins 311 of the contacting head 31 and the contact pins 61 of the test chip 6 can be avoided.

It will be appreciated that although a particular embodiment of the invention has been shown and described, modifications may be made. It is intended in the claims to cover such modifications which come within the spirit and scope of the invention.

The invention claimed is:

1. A chip test fixture for assisting in inspecting a test chip on a printed circuit board, the chip test fixture comprising:
   a switching module including a standard chip and a switch element configured to enable either the standard chip or the test chip to work on the printed circuit board;
   a pin cord connected with the switch module at one end and formed with a contacting head at the other end; the contacting head having a set of contact pins corresponding to that of the test chip; and
   a magnetic unit configured to draw the contacting head of the pin cord and the test chip together in such a way that the contact pins of the contacting head are in contact with that of the test chip once the contacting head approaches the test chip.

2. The chip test fixture of claim 1, wherein the magnetic unit includes a magnet and a magnetic sticker to be attracted by the magnet; and the magnet is secured on the contacting head of the pin cord while the magnetic sticker is adhered to the test chip.

3. The chip test fixture of claim 2, wherein the north and south magnetic poles of the magnet are arranged to attract the south and north magnetic poles of the magnetic sticker respectively.

4. The chip test fixture of claim 2, wherein the magnetic sticker has an upper magnetic pole and a lower opposite magnetic pole; and when the magnetic sticker is adhered to the test chip, the lower magnetic pole of the magnetic sticker is bonded with a top surface of the test chip while the upper magnetic pole of the magnetic sticker is ready for upwardly attracting a magnetic pole of the magnet.

5. The chip test fixture of claim 2, wherein the magnet has an upper magnetic pole and a lower opposite magnetic pole; and the lower magnetic pole of the magnet is provided for downwardly attracting a magnetic pole of the magnetic sticker.

6. The chip test fixture of claim 1, wherein the magnetic unit includes a magnet and a sheet metal to be attracted by the magnet; and the magnet and the sheet metal are secured on the contacting head of the pin cord and test chip respectively.

7. The chip test fixture of claim 1, wherein the contacting head of the pin cord defines a cavity in a bottom thereof for reception of the test chip; and the contact pins of the contacting head is exactly in contact with that of the test chip once the test chip is received in the cavity of the contacting head.

8. The chip test fixture of claim 2, wherein the contacting head of the pin cord defines a cavity in a bottom thereof for reception of the test chip; and the contact pins of the contacting head is exactly in contact with that of the test chip once the test chip is received in the cavity of the contacting head.

9. The chip test fixture of claim 3, wherein the contacting head of the pin cord defines a cavity in a bottom thereof for reception of the test chip; and the contact pins of the contacting head is exactly in contact with that of the test chip once the test chip is received in the cavity of the contacting head.

10. A pin connector for joining an electronic device to a set of contacting pins of a chip, the pin connector comprising:
    a pin cord including a contacting head and a connecting plug at opposite ends thereof; the contacting head having a set of contact pins corresponding to that of the test chip; the connecting plug presented for connecting with the electronic device; and
    a magnetic unit configured to draw the contacting head of the pin cord and the test chip together in such a way that the contact pins of the contacting head are drawn to be in contact with that of the test chip once the contacting head approaches the test chip.

11. The pin connector of claim 10, wherein the magnetic unit includes a magnet and a magnetic sticker to be attracted by the magnet; and the magnet is secured on the contacting head of the pin cord while the magnetic sticker is adhered to the chip.

12. The pin connector of claim 11, wherein the north and south magnetic poles of the magnet are arranged to attract the south and north magnetic poles of the magnetic sticker respectively.

13. The pin connector of claim 11, wherein the magnetic sticker has an upper magnetic pole and a lower opposite magnetic pole; and when the magnetic sticker is adhered to the chip, the lower magnetic pole of the magnetic sticker is bonded with a top surface of the chip while the upper magnetic pole of the magnetic sticker is ready for upwardly attracting a magnetic pole of the magnet.

14. The pin connector of claim 11, wherein the magnet has an upper magnetic pole and a lower opposite magnetic pole; and the lower magnetic pole of the magnet is provided for downwardly attracting a magnetic pole of the magnetic sticker.

15. The pin connector of claim 10, wherein the magnetic unit includes a magnet and a sheet metal to be attracted by the magnet; and the magnet and the sheet metal are secured on the contacting head of the pin cord and chip respectively.

16. The pin connector of claim 10, wherein the contacting head of the pin cord defines a cavity in a bottom thereof for reception of the chip; and the contact pins of the contacting head is exactly in contact with that of the chip once the chip is received in the cavity of the contacting head.

17. The pin connector of claim 11, wherein the contacting head of the pin cord defines a cavity in a bottom thereof for reception of the chip; and the contact pins of the contacting head is exactly in contact with that of the chip once the chip is received in the cavity of the contacting head.

18. The pin connector of claim 12, wherein the contacting head of the pin cord defines a cavity in a bottom thereof for reception of the chip; and the contact pins of the contacting head is exactly in contact with that of the chip once the chip is received in the cavity of the contacting head.

* * * * *